(12) United States Patent
Yin et al.

(10) Patent No.: US 7,789,719 B1
(45) Date of Patent: Sep. 7, 2010

(54) PROBE CONNECTOR

(75) Inventors: Te-Hung Yin, Tu-Cheng (TW); Yung-Yi Chen, Tu-Cheng (TW); Shu-Fang Li, Tu-Cheng (TW); Jui-Pin Lin, Tu-Cheng (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 12/458,001

(22) Filed: Jun. 29, 2009

(51) Int. Cl.
*H01R 13/24* (2006.01)
(52) U.S. Cl. .................................. 439/824; 439/700
(58) Field of Classification Search ................. 439/169, 439/66, 700, 824
See application file for complete search history.

(56) References Cited

U.S. PATENT DOCUMENTS

| 6,340,320 | B1* | 1/2002 | Ogawa | 439/824 |
|---|---|---|---|---|
| 6,814,626 | B2* | 11/2004 | Wen-Yao | 439/700 |
| 6,935,906 | B2* | 8/2005 | Orihara | 439/824 |
| 6,957,986 | B2* | 10/2005 | Jing | 439/700 |
| 7,021,976 | B2* | 4/2006 | Sekiguchi | 439/824 |
| 7,359,129 | B2* | 4/2008 | Chiu et al. | 359/809 |
| 7,507,110 | B1* | 3/2009 | Yin et al. | 439/482 |
| 2008/0003888 | A1* | 1/2008 | Xu | 439/700 |
| 2010/0089187 | A1* | 4/2010 | Yin et al. | 73/866.5 |

* cited by examiner

*Primary Examiner*—Edwin A. Leon
*Assistant Examiner*—Larisa Tsukerman
(74) *Attorney, Agent, or Firm*—Rosenberg, Klein & Lee

(57) ABSTRACT

A probe connector has a barrel with a main body surrounding a chamber therein. The main body has a slot communicating with the chamber. A plunger includes a basic portion restricted in the barrel and a contact portion extended from one end of the basic portion. A fixing element has a fixing ring wrapping a periphery of the main body, a portion of the fixing ring extended perpendicular to the fixing ring to form a connecting rod. The connecting rod has a portion bent towards the same direction as an extending direction of a radius of the fixing ring to form a resting portion buckling into the chamber of the main body through the slot. The resting portion resiliently abuts against a side of the plunger when the plunger is pressed downwards to deflect to contact an inner surface of the main body by an opposite side thereof.

6 Claims, 4 Drawing Sheets

PROBE CONNECTOR

BACKGROUND OF THE INVENTION

1. Field of the Invention

The present invention relates to a probe connector, and particularly to a probe connector having a structure capable of improving the connection stability between a barrel and a plunger thereof.

2. The Related Art

Please refer to FIG. 4, a conventional probe connector 1' includes a barrel 10', an elastic element 30' received in the barrel 10', a plunger 20' mounted to the barrel 10'. The barrel 10' has a cylindraceous main body 11' and a base 12' seated at one end of the main body 11', surrounding a chamber 13' which has an inner diameter larger than an outer diameter of the elastic element 30'. The other end of the main body 11' is bent inwards to form an opening 14'. The plunger 20' has a basic portion 21', which is movably received in the chamber 13' of the barrel 10' and supported by the elastic element 30', and a contact portion 22', which is extended from an end of the basic portion 21' opposite to the elastic element 30' and exposes from the opening 14' of the barrel 10' to contact an outer electrical device. Generally, in use, the elastic element 30' is compressed and distorted to provide a supporting force which makes the plunger 20' deflect to contact an inner surface of the main body 11'. However, such electrical connection between the barrel 10' and the plunger 20' is unstable and apt to break off instantly and discontinuously when the probe connector 1' suffers from an unexpected force, thereby affecting the normal use of the probe connector 1'.

SUMMARY OF THE INVENTION

Accordingly, an object of the present invention is to provide a probe connector having a structure capable of improving the connection stability between a barrel and a plunger thereof. The barrel has a cylindraceous main body surrounding to form a chamber therein, and a base connected with one end of the main body. The main body has a slot at a substantial middle portion thereof and communicating with the chamber. The plunger includes a basic portion restricted in the barrel and a contact portion extended from one end of the basic portion and exposed from the other end of the barrel opposite to the base. A fixing element has a fixing ring wrapping a periphery of the main body. A portion of the fixing ring is extended perpendicular to the fixing ring to form a connecting rod. The connecting rod has a portion bent towards the substantially same direction as an extending direction of a radius of the fixing ring towards the center thereof to form a resting portion buckling into the chamber of the main body through the slot. The resting portion resiliently abuts against a side of the basic portion when the contact portion is pressed downwards to deflect to contact an inner surface of the main body by an opposite side thereof.

As described above, the fixing element has the resting portion buckling into the chamber of the barrel through the slot. When the plunger is pressed downwards to make the basic portion extrude the resting portion outwards, in turn, the resting portion provides the opposite force pushing the basic portion to contact the inner surface of the main body steadily, preventing the basic portion from breaking off the main body instantly and discontinuously when the probe connector suffers from the unexpected force.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
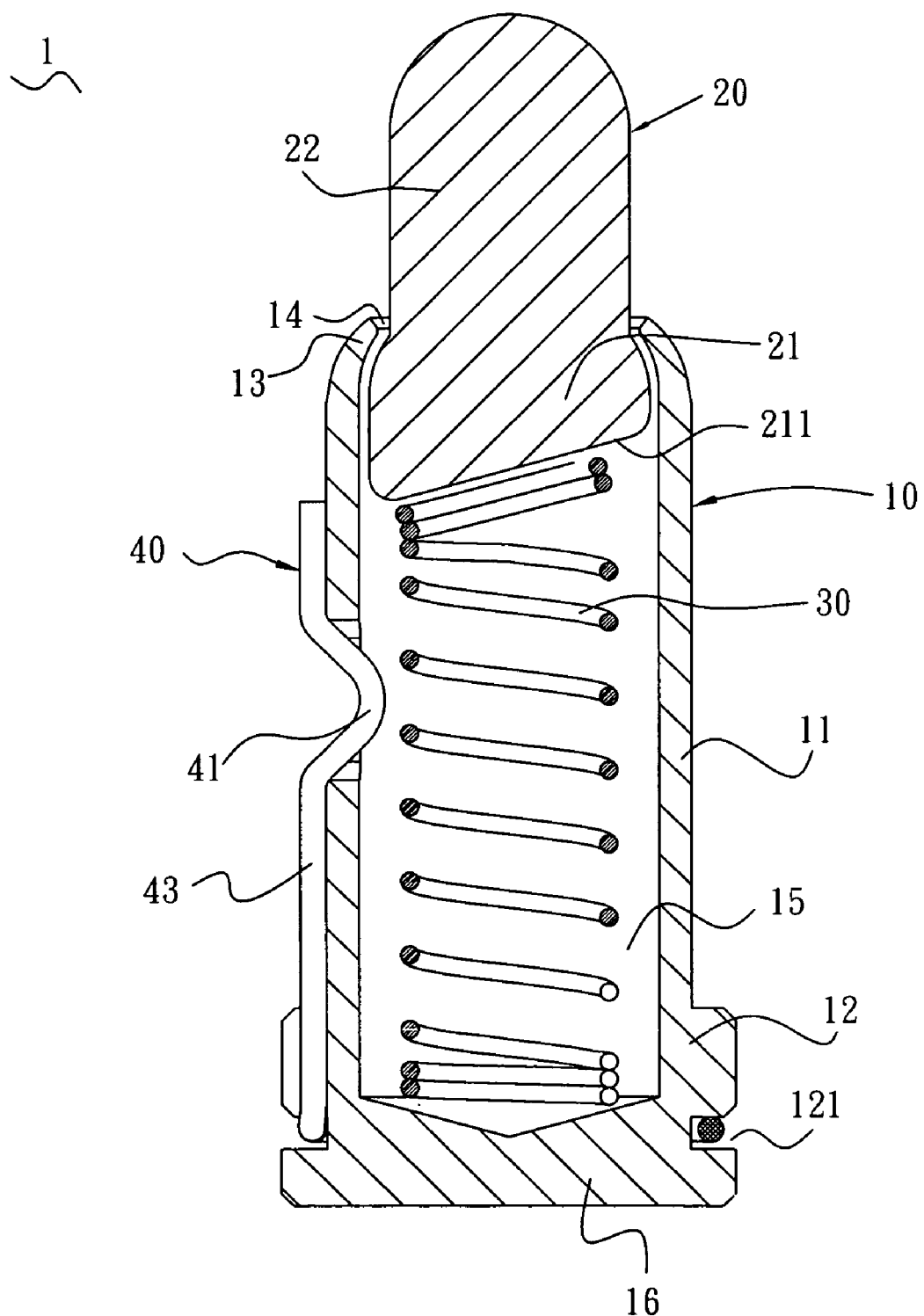
FIG. 1 is a cross-sectional view of a probe connector of an embodiment in accordance with the present invention.
Figure 2:
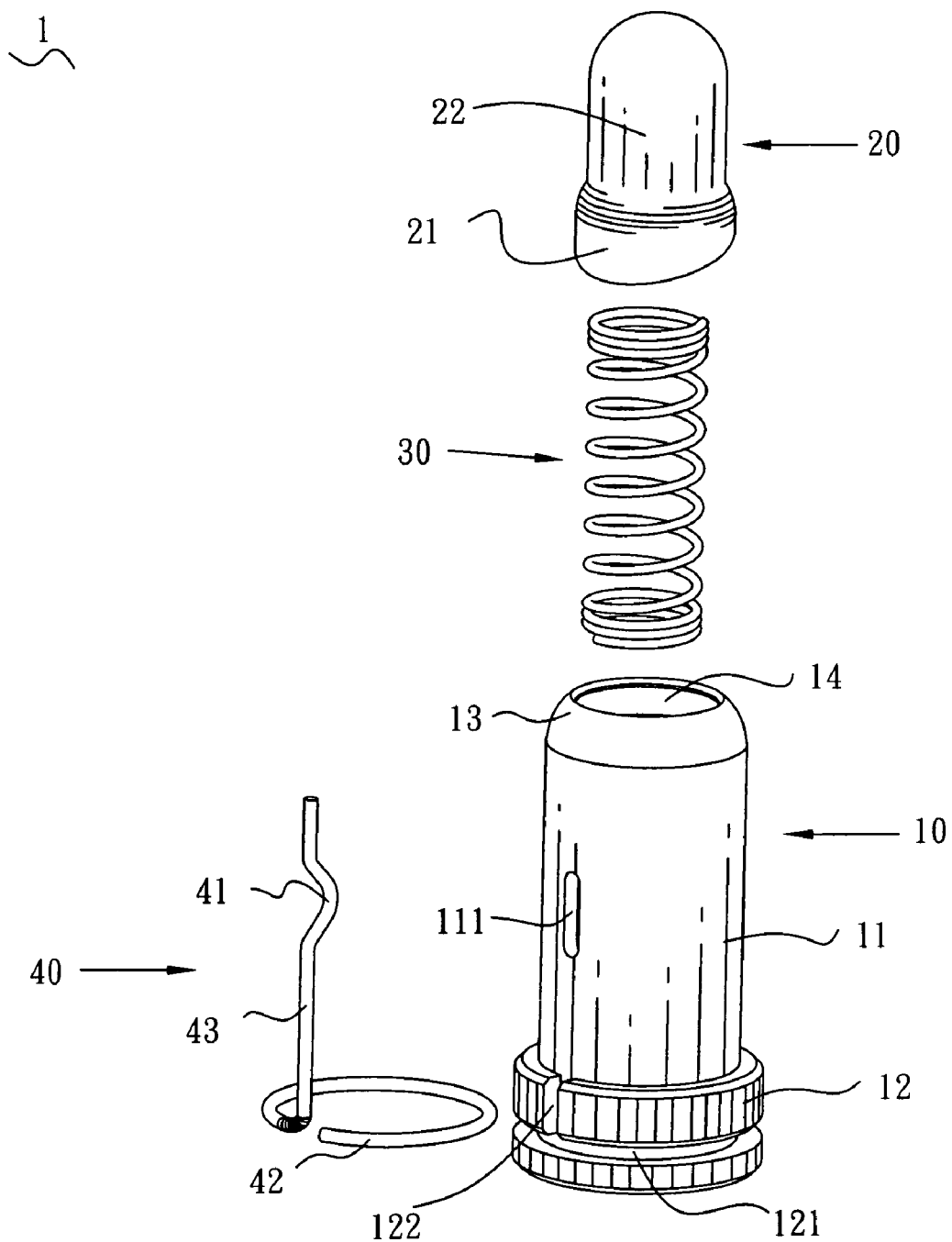
FIG. 2 is an exploded, perspective view of the probe connector shown in FIG. 1.

With reference to FIGS. 1-2, the embodiment in accordance with the present invention is embodied in a probe connector 1. The probe connector 1 includes a hollow barrel 10, a plunger 20 and an elastic element 30 received in the barrel 10. The barrel 10 and the plunger 20 are made of metallic material.

The barrel 10 includes a cylindraceous main body 11 surrounding to form a chamber 15 therein, and a base 16 integrated with a bottom end of the main body 11 to show a single piece. The main body 11 has a slot 111 at a substantial middle portion thereof and extending along a top-bottom direction, communicating with the chamber 15. An outer surface of the main body 11 has a portion protruded outwards to form a stopping portion 12 that is spaced away from the base 16 to form a restraining groove 121. In this embodiment, the stopping portion 12 extends along a circumference of the outer surface of the main body 11 to show a ring shape. A portion of the stopping portion 12 is formed with a leading slot 122 in alignment with the slot 111 and passing through the stopping portion 12 along the top-bottom direction, communicating with the restraining groove 121. A top end of the main body 11, opposite to the base 16, is open and bent inwards to form a shoulder 13 after the plunger 20 is mounted to the barrel 10. An opening 14 is surrounded by the shoulder 13 for allowing the plunger 20 to pass therethrough.

The plunger 20 of cylindrical shape includes a basic portion 21 and a contact portion 22 extending outwards from one end of the basic portion 21. The basic portion 21 defines a ramped bottom surface 211 opposite to the contact portion 22. The diameter of the contact portion 22 is less than that of the basic portion 21, with a free end shaped as a dome. The basic portion 21 is received in the chamber 15 of the barrel 10 and the contact portion 22 extends out of the barrel 10 through the opening 14. The outer dimension of the basic portion 21 is less than the inner dimension of the main body 11 for allowing the basic portion 21 to be inclinably received in the chamber 15. The dimension of the opening 14 is less than the outer dimension of the basic portion 21 for preventing the basic portion 21 from removing out of the chamber 15. The elastic element 30 is arranged inside the main body 11, with two ends abutting against the ramped bottom surface 211 of the basic portion 21 and the base 16.

The probe connector 1 further has a fixing element 40 mounted to the barrel 10. The fixing element 40 has a split fixing ring 42 received in the restraining groove 121. An end of the fixing ring 42 is extended perpendicular to the fixing ring 42 to form a connecting rod 43. The connecting rod 43 has a portion adjacent to a free end thereof bent towards the substantially same direction as an extending direction of a radius of the fixing ring 42 towards the center of the fixing ring 42 to form a resting portion 41 of arc shape. In assembly, the fixing ring 42 is received in the restraining groove 121. The connecting rod 43 is adjusted to be seated in the leading slot 122 and leans against an outer surface of the main body 11. The resting portion 41 buckles into the chamber 15 through the slot 111.

Figure 3:
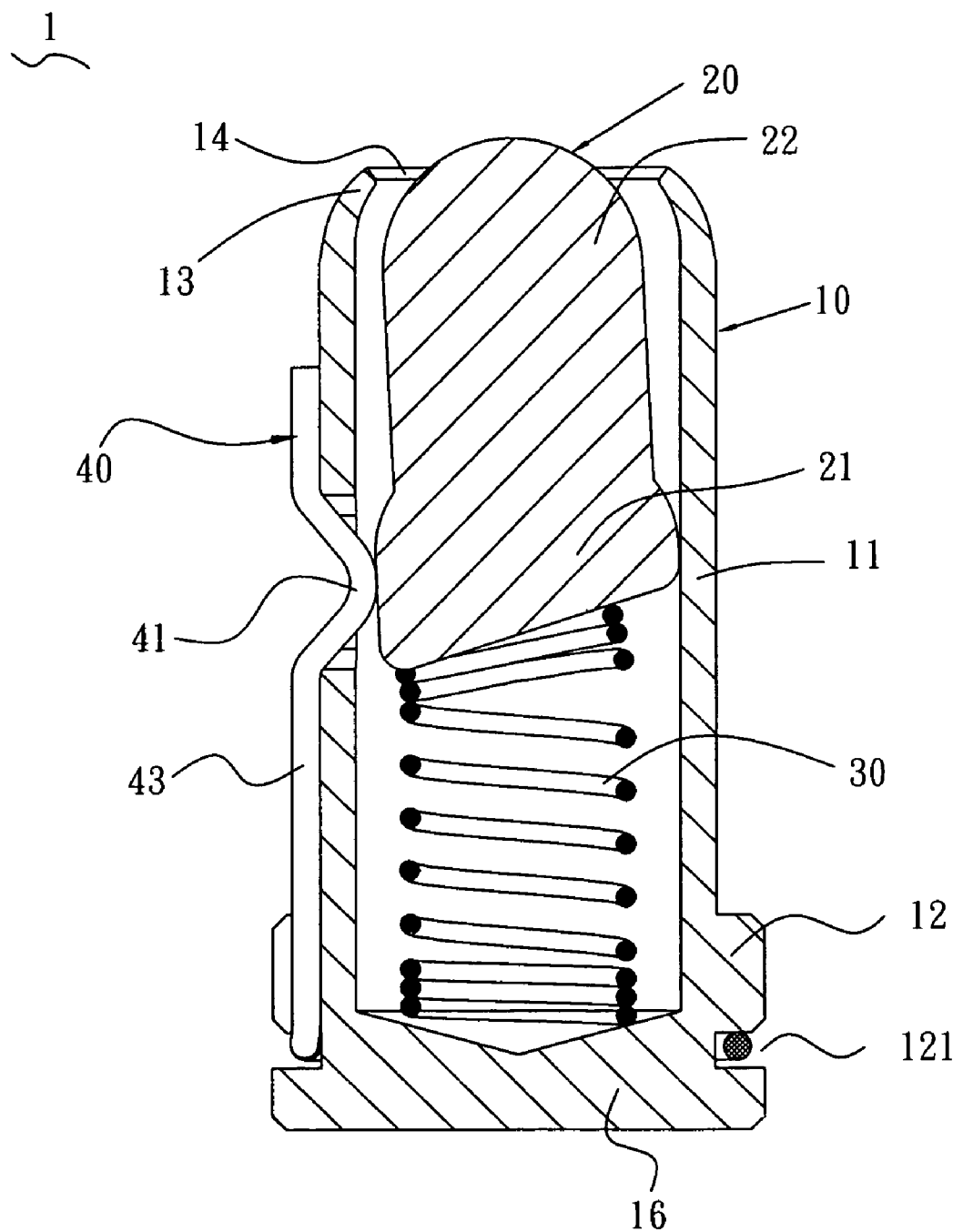
FIG. 3 is a cross-sectional view of the probe connector shown in FIG. 1, wherein a plunger is pressed inside a barrel.
Figure 4:
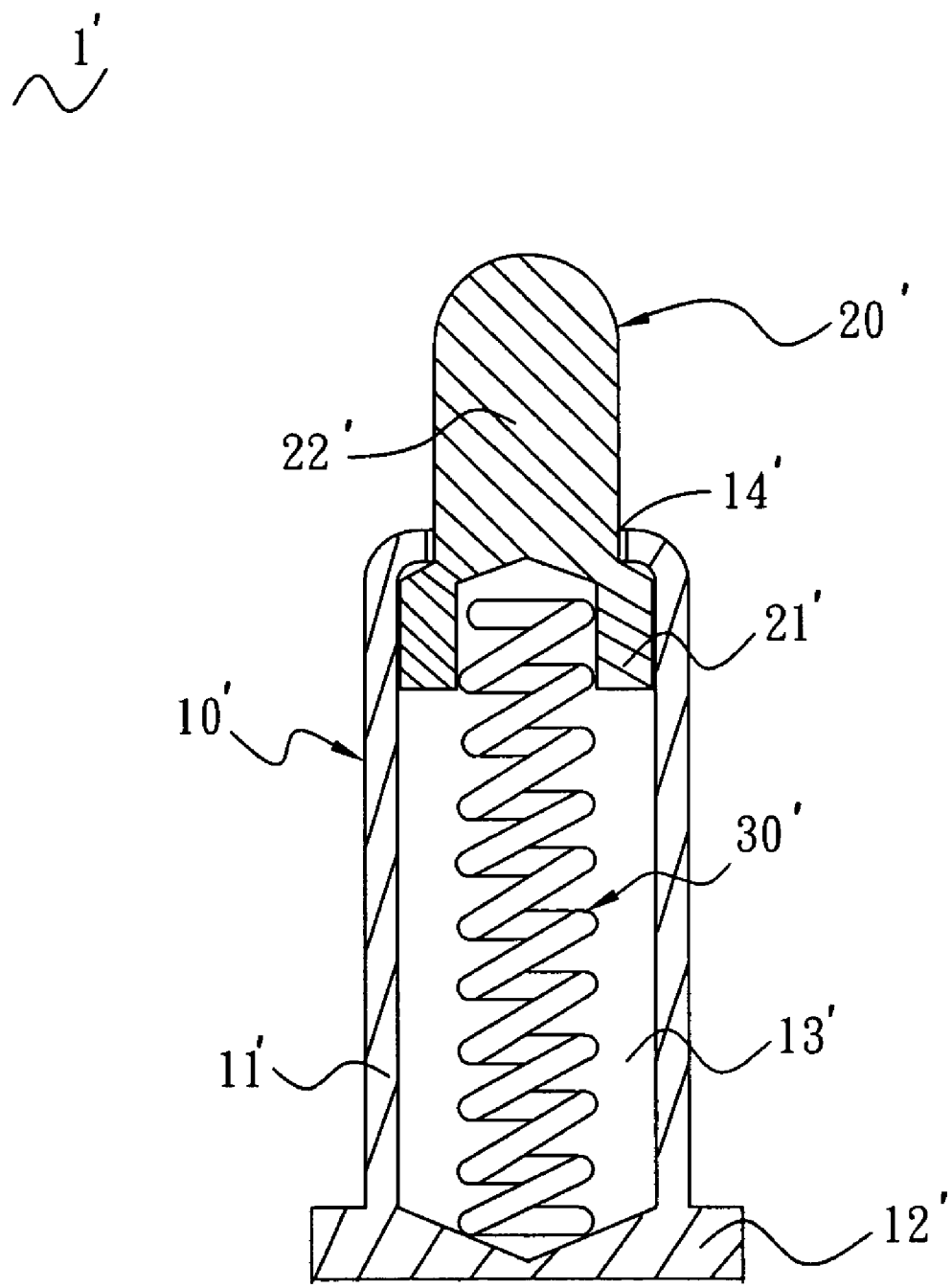
FIG. 4 is a cross-sectional view of a probe connector in prior art.

Please refer to the FIG. 3, when the contact portion 22 of the plunger 20 is pressed downwards, the elastic element 30 is compressed downwards and distorted by the ramped bottom surface 211 of the basic portion 21 and generates an opposite force which acts on the ramped bottom surface 211 so that the basic portion 21 is deflected to contact an inner surface of the main body 11. The resting portion 41 is resiliently extruded outwards by the basic portion 21 and generates an opposite force which acts on a portion of the basic portion 21 substantially opposite to the connection of the basic portion 21 and the main body 11, reinforcing the contacting stability between the basic portion 21 and the main body 11, without affecting by an unexpected shock or the like.

As described above, the fixing element 40 has the resting portion 41 buckling into the chamber 15 of the barrel 10 through the slot 111. When the plunger 20 is pressed downwards to make the basic portion 21 extrude the resting portion 41 outwards, in turn, the resting portion 41 provides the opposite force pushing the basic portion 21 to contact the inner surface of the main body 11 steadily, preventing the basic portion 21 from breaking off the main body 11 instantly and discontinuously when the probe connector 1 suffers from the unexpected force.

The foregoing description of the present invention has been presented for the purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A probe connector, comprising:
   a barrel having a cylindraceous main body surrounding to form a chamber therein, and a base connected with one end of the main body, the main body having a slot at a substantial middle portion thereof and communicating with the chamber;
   a plunger including a basic portion restricted in the barrel and a contact portion extended from an end of the basic portion and exposed from the other end of the barrel opposite to the base; and
   a fixing element having a fixing ring wrapping a periphery of the main body, a portion of the fixing ring extended perpendicular to the fixing ring to form a connecting rod, the connecting rod having a portion bent towards the substantially same direction as an extending direction of a radius of the fixing ring towards the center therof to form a resting portion buckling into the chamber of the main body through the slot,
   wherein the resting portion resiliently abuts against a side of the basic portion when the contact portion is pressed downwards to deflect to contact an inner surface of the main body by an opposite side thereof.

2. The probe connector as claimed in claim 1, wherein an outer surface of the main body is protruded outwards to form a stopping portion, the stopping portion extends along a circumference of the main body to show a ring shape and is spaced away from the base to form a restraining groove therebetween for receiving the fixing ring.

3. The probe connector as claimed in claim 2, wherein the stopping portion is formed with a leading slot located in alignment with the slot and communicating with the restraining groove, the connecting rod is received in the leading slot and attached to the main body.

4. The probe connector as claimed in claim 1, wherein the fixing ring is split, the connecting rod is extended perpendicularly from an end of the fixing ring.

5. The probe connector as claimed in claim 1, wherein the resting portion is an arc shape and adjacent to a free end of the connecting rod.

6. The probe connector as claimed in claim 1, further comprising an elastic element arranged inside the barrel, the basic portion being shaped with a ramped bottom surface against an end of the elastic element for making the basic portion deflect to touch the main body when the plunger is pressed downwards.

* * * * *